(12) United States Patent
Mayer et al.

(10) Patent No.: US 11,635,478 B2
(45) Date of Patent: Apr. 25, 2023

(54) QUICK COUPLING FOR MOUNTING AN NMR PROBE ON A SHIM SYSTEM

(71) Applicant: Bruker Switzerland AG, Faellanden (CH)

(72) Inventors: Markus Mayer, Gossau (CH); Franco Sestito, Winterthur (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 17/748,198

(22) Filed: May 19, 2022

(65) Prior Publication Data

US 2022/0373622 A1     Nov. 24, 2022

(30) Foreign Application Priority Data

May 20, 2021   (DE) .................. 10 2021 205 192.8

(51) Int. Cl.
*G01R 33/34*     (2006.01)
*G01R 33/3873*   (2006.01)

(52) U.S. Cl.
CPC ......... *G01R 33/34* (2013.01); *G01R 33/3873* (2013.01)

(58) Field of Classification Search
CPC .. G01R 33/30; G01R 33/34; G01R 33/34007; G01R 33/3802
See application file for complete search history.

(56) References Cited

U.S. PATENT DOCUMENTS

| | | | |
|---|---|---|---|
| 9,500,726 | B2 | 11/2016 | Baumann |
| 9,726,735 | B2 | 8/2017 | Schmidig et al. |
| 10,379,179 | B2 | 8/2019 | Meister et al. |
| 2009/0015259 | A1 | 1/2009 | Courtney |

FOREIGN PATENT DOCUMENTS

| | | |
|---|---|---|
| DE | 102013204131 B3 | 3/2013 |
| DE | 102013212312 B4 | 2/2017 |
| DE | 102017215763 B3 | 6/2018 |

OTHER PUBLICATIONS

Manual Probes, User Manual Version 003, NMR Spectroscopy, Bruker BioSpin AG, Sep. 2009, 54 pages.

*Primary Examiner* — Steven L Yeninas
(74) *Attorney, Agent, or Firm* — Edell, Shapiro & Finnan, LLC (57) ABSTRACT

A fastening device for releasably fastening a probe (1) to an NMR magnet (2). An insert part (3) fastens the probe to a retaining system (4) connected to the magnet. A force-variable connection is established by the insert part with spring elements (8). The probe fastens to the insert part with rigid retaining elements (6). When closed, a connection without mechanical play exists between the insert part and the retaining elements when the spring elements are under tension. An annular disc-shaped pretensioning element (9) is arranged between the insert part and the retaining system. By rotating the pretensioning element relative to the insert part, the pretensioning element presses on and pretensions the spring elements. When open, the spring elements and the retaining elements are configured to connect with a mechanical play of 0.5 to 5 mm between the insert part and the retaining elements when the spring elements are pretensioned.

20 Claims, 4 Drawing Sheets

QUICK COUPLING FOR MOUNTING AN NMR PROBE ON A SHIM SYSTEM

CROSS REFERENCE TO RELATED APPLICATIONS

This application claims foreign priority under 35 U.S.C. § 119(a)-(d) to German Patent Application 10 2021 205 192.8 filed on May 20, 2021, the contents of which are incorporated into the present application by reference in their entirety.

FIELD OF THE INVENTION

The invention relates to a fastening device for releasably fastening an NMR probe to an NMR magnet, the main axis of which runs parallel to a z-direction, with an insert part which, in order to fasten the NMR probe, is configured to push from below against a retaining system which is arranged on the underside of the NMR magnet, is rigidly connected to the magnet and is part of the fastening device, wherein a fixed mechanical connection is establishable between the probe and the insert part on the one hand and between the insert part and the retaining system on the other hand, after the NMR probe is pushed against the underside of the insert part facing away from the retaining system until the upper end of the probe comes into contact with the upper end of the retaining system, wherein the insert part is configured such that, with the aid of at least one spring element, in addition to a form fit, a force-variable connection is established between the probe and the retaining system, the probe being configured to fasten to the insert part through a plurality of one-piece rigid retaining elements, each of unchangeable fixed length, which are part of the fastening device, and wherein in a closed state, there is a connection without mechanical play between the insert part and the retaining elements when the spring element is under mechanical tension.

Such an arrangement is known from DE 10 2017 215 763 B3 (=reference [1]).

BACKGROUND

NMR methods are used to analyze sample compositions or to determine the structure of substances in samples. NMR spectroscopy is a powerful method of instrumental analysis. In these NMR methods, the sample is exposed to a strong static magnetic field $B_0$ in a z-direction. This leads to an interaction with the nuclear spins of the sample material, in particular to the alignment of nuclear spins in the substance to be measured. For this purpose, orthogonal high-frequency electro-magnetic pulses are then radiated into the sample in the x- or y-direction. The development over time of these nuclear spins in turn produces high-frequency electromagnetic fields, which are detected in the NMR apparatus. Information regarding the properties of the sample is integrally obtainable from the detected HF fields over a certain physical range. In particular, the chemical composition and the chemical bonding behaviors in the sample can be determined from the position and intensity of NMR lines (see, for example, DE 10 2013 204 131 B3=reference [2]).

The sample to be measured usually consists of a cylindrical sample tube with a usually circular, oval or rectangular cross-section, which contains the solid or liquid substance to be measured. The sample tube is capped at least on the side that first enters the probe and is typically located in a spinner. Sample tubes and spinners are transported into the probe from outside the magnet using a transport system. In the following, it is assumed that the insertion opening is at the top of the probe and the sample tube is inserted into the probe from above. However, it is also feasible to insert the sample tube from below into an opening in the probe provided for this purpose. This case is analogous to the one mentioned above and is not explicitly described for reasons of clarity. When the sample tube is in the measuring position, the spinner is inside the turbine. The turbine allows the sample tube to rotate (see, for example, DE 10 2013 212 312 B4=reference [3]).

The Bruker BioSpin AG company brochure "Manual Probes. User Manual Version 003" from September 2009 (=reference [4]) describes, in particular in chapters 5.2 and 5.8, a fastening device for releasably fastening an NMR probe to an NMR magnet, with a disc-shaped insert part which is designed such that, with the aid of a spring element, in addition to a form fit, a force-variable connection is also established between the probe and the retaining system.

The so-called "Standard Bore" probes currently available are fastened to a SHIM system using two screws. This is very cumbersome for the user, since he has to crawl under the magnet to mount the probe and work there while kneeling. On the other hand, the relatively small screws are very cumbersome due to the mounting position of the probe on the magnet and can usually only be tightened with a special screwdriver.

When the fixing screws are tightened, the fastening is fixed and can no longer adapt to later changes in length, which may be caused by temperature changes, for example. These changes in length can then cause mechanical play or impermissible axial tension between the probe and the retaining system.

The current so-called "Wide Bore" probes are mounted on the retaining system with a quick-release fastener that is already known per se. Due to the design-related gate shape of the tensioning system, when operating the tension ring, the maximum force is applied to the probe at the beginning of the mounting process. After overcoming this maximum force, the system relaxes again and the probe is mounted with an undefined force up to a possibly no longer tolerable play in the SHIM system of the NMR apparatus.

In order to avoid these difficulties, the retaining elements of each probe must be adjusted individually to the respective SHIM system. However, the set force cannot be checked. It can only be checked whether there is mechanical play (tolerable or no longer tolerable) or not.

Until recently, these circumstances made it impossible to use the quick-release fastener according to reference [4], which is already known from the "Wide Bore" probes, for mounting "Standard Bore" probes, since it is very important with the "Standard Bore" probes that there is absolutely no play or excessive force between the probe and the SHIM system.

In addition, with the known quick-release fastener of "Wide Bore" probes according to reference [4], there is no locking device against unintentional opening. However, this is a fixed requirement due to safety considerations and the resulting marketing considerations for the "Standard Bore" probes.

The generic fastening device according to reference [1] cited above, on the other hand, in contrast to the previously conventional design, always has a force defined in a specific region between the probe and the retaining system for both "Wide Bore" probes and for "Standard Bore" probes when mounted. The spring element is designed there so that the retaining force increases continuously when the retaining element is actuated and reaches its maximum in the final position. This configuration of the spring element—already known per se—now means that it is no longer possible for play to occur between the probe and the NMR magnet system or a SHIM system in the final mounting position.

As a result of the possibilities of such a quick-release fastener opened up by the fastening device according to reference [1], it is no longer possible for the user to accept incorrect manipulations when mounting the NRM probe on the retaining system, such as when adjusting the retaining elements in a "Wide Bore" system. Since the length tolerances of the components involved are absorbed through spring elements in the quick-change system according to the present invention, it can no longer be the case that the system is in a mechanically undefined state.

However, the significantly improved fastening device disclosed in reference [1] still has the following disadvantages:

The friction of the rotating spring element leads to wear on the retaining element.

The friction between these two parts results in a relatively large operating force.

At least two hands are required to install the NMR probe: one to hold the NMR probe, and the other to actuate the locking device.

Mounting the quick-release fastener on the shim system (namely overhead) is complicated because of the pretensioned spring element.

SUMMARY

In contrast, it is an object of the present invention to modify a fastening device of the type defined at the outset using simple technical measures, such that the disadvantages listed above are avoided either completely or at least as far as possible without causing a reduction in the quality of the NMR measurements, but while nonetheless keeping the NMR probe particularly compact and while reducing material costs and production costs.

A further object of the present invention is to allow the probe to be changed quickly without risking a significantly reduced service life of the probe as a result.

BRIEF DESCRIPTION OF THE INVENTION

According to one formulation, these objects are achieved surprisingly simply and effectively in that, in a fastening device with the characteristics defined at the outset, an annular disc-shaped pretensioning element is arranged between the insert part and the retaining system, designed so that, by rotating the pretensioning element about its disc axis relative to the insert part, the pretensioning element presses on the spring element and thereby pretensions it, and in that the spring element of the insert part and the retaining elements are geometrically designed so that in an open state, there is a connection with a mechanical play of 0.5 mm to 5 mm between the insert part and the retaining elements when the spring element is pretensioned by the pretensioning element.

In the solution known from reference [1], the spring element is brought into engagement with the retaining element on the probe by rotation and then tensioned by further rotation. According to the teaching of the present invention, on the other hand, the insert part with the two spring elements is no longer rotated and is instead fixed. Thereby, in order to install the probe, the spring elements are pressed flat and thus pretensioned.

With the solution according to the invention, there is no friction at all due to a rotating spring element, which in the prior art leads to increased wear on the retaining element because of the relatively large actuating force required between these two parts.

The pretensioning of the spring elements, the installation of the probe and the release of the spring elements take place step by step. As a result, the NMR probe can now be mounted with one hand, because one hand no longer has to hold the NMR probe while the other actuates the locking device, rather the probe can now be inserted into the shim system together with the fastening device.

The previously relatively complicated overhead mounting of the quick-release fastener on the shim system is made noticeably easier as a result of the pretensioned spring element. A simple rotation of the pretensioning element designed according to the invention then brings about the final fastening of the NMR probe.

At this point it should be noted that the various advantages associated with the invention are achieved not only with vertical NMR spectrometers, but also with NMR systems with a horizontal or inclined z-axis. The specified axial positions then must no longer necessarily be "above" or "below" the NMR magnet coil system. Instead, they may be "to the right" or "to the left" of the system. In any case, gravity plays only a minor role in the operation of embodiments structured in accordance with the present invention.

PREFERRED EMBODIMENTS OF THE INVENTION

Depending on the specific application, embodiments of the fastening device according to the invention may be useful in which the annular disc-shaped pretensioning element is made of non-magnetic material, preferably of spring bronze. In particular, the disc-shaped insert part can comprise a spring link made of non-magnetic material, preferably made of spring bronze such as Berylco®.

The advantage is that no additional forces caused by the interaction of the NMR magnet and magnetic materials affect the mechanics. In addition, a magnetic material can lead to field disturbances, which can then affect the NMR measurement.

In advantageous developments of these embodiments, the spring link is constructed in one piece. This makes it possible in a particularly simple manner firstly to carry out cost-effective production (no assembly work) and secondly to use the installation space optimally. With a one-piece element, no connecting parts that take up space are required. This space is usable for spring strength and spring length. This in turn results in more spring deflection.

Preferred are embodiments of the fastening device according to the invention in which there are at least two, preferably three or four spring elements, distributed uniformly about an axis perpendicular to the plane of the insert part. As a result, there is no tilting moment during actuation.

A preferred class of embodiments of the invention is characterized in that a retaining portion, which is rigidly fastened, is reversibly mountable on the underside of the retaining system facing away from the magnet. The advantage is that the quick-release fastener is retrofittable to already installed NMR magnets or retaining systems.

In advantageous developments of this class of embodiments, the retaining portion is annular and has on its radially inner side a radially inwardly projecting lug for each spring element of the insert part, the fastening device also being held together as a quick-release fastener unit under the pretensioning of the spring elements caused by a rotation of the pretensioning element about its disc axis relative to the insert part. The lugs of the retaining portion ensure that the entire quick-release fastener unit is held together even when the spring elements are pretensioned. This means that it is possible to pretension the spring elements by turning the roller carrier, which simplifies mounting the quick-release unit on the shim system, since the spring elements do not have to be tensioned by the mounting itself. This simplification in terms of mounting is particularly welcome because, as specified earlier, mounting must be carried out overhead under the magnet.

A further, preferred class of embodiments of the invention is characterized in that the spring elements have a fork-shaped receptacle at their respective free end, into which the retaining elements are suspendable during mounting by rotating the probe about its axis. The probe is thus insertable into the shim system and its retaining elements are suspendable in the forks of the spring elements with a small rotary movement about the z-axis. By turning back the pretensioning element, the spring elements are released and relaxed until the probe is fixed in the final position with its retaining elements.

Advantageous developments of this class of embodiments are characterized in that a cam is provided on the pretensioning element to match each fork-shaped receptable of a spring element, which cam rests on the respective retaining element in order to prevent the probe from being rotatable back about its axis as a result of the force being applied, so that the retaining elements can slide out of the fork-shaped receptacles, wherein the spring elements are released and relaxed by turning back the pretensioning element until the probe is fixed in the final position with its retaining elements. This prevents the probe from accidentally falling down.

In further preferred variants of these developments, a locking device is provided to prevent a retainer from being released unintentionally, wherein the locking device engages as far as it will go when turning the pretensioning element further, and the cams on the pretensioning element which are in contact with the retaining elements prevent the probe from turning back and the retaining elements from sliding out of the fork-shaped receptacles. Such a locking mechanism always protects the new fastening system against unintentional opening.

These steps for mounting the probe and in reverse order for dismounting may be carried out with one hand, which is particularly advantageous given the confined space conditions under the NMR magnet.

A class of embodiments of the invention is advantageous for many practical applications, in which the insert part is constructed in the form of disc segments, wherein each disc segment of the insert part carries a spring element. This means that instead of the insert part with the spring elements, separate spring elements are mechanically connected to the retaining portion. The main idea behind separating the spring elements is, on the one hand, to require less material (for example, Berylco® is relatively expensive) and, on the other hand, to integrate the spring elements into the retaining portion when it is produced by injection molding.

In advantageous developments of this class of embodiments, a plain bearing is provided between the pretensioning element and the retaining system. The advantage is that the operating force is minimal. The plain bearing is much easier to mount than the ball bearing of the "Wide Bore" probe.

Alternatively or additionally, in preferred developments, a plain bearing may also be provided between the pretensioning element and the spring elements.

Finally, these variants may be further improved by selecting the materials of the sliding partners in the plain bearing so as to minimize the operating force and abrasion, with PET-C and spring bronze preferably being used as the sliding partners. The advantage is that this choice of material means that the main components (insert part and retaining element) are directly usable as sliding partners.

In an alternative class of preferred embodiments of the invention, the insert part is constructed in the form of a disc and the pretensioning element is constructed as a roller carrier with rollers arranged on it. As a result, there is essentially only rolling friction, such that the actuating force is even lower, and even less wear occurs on the retaining elements when the device is actuated.

Developments of this class of embodiments are advantageous in which at least some of the rollers of the pretensioning element are designed as tension rollers which, when the pretensioning element rotates about its disc axis relative to the insert part, press on and thus pretension the spring element.

Alternatively or additionally, further advantageous developments are characterized in that at least some of the rollers of the pretensioning element are designed as support rollers which press on the retaining system and which roll with little friction when the pretensioning element rotates about its disc axis relative to the insert part on the retaining system, in particular on a base plate of a shim system of the NMR magnet for field shaping the homogeneous magnetic field in an NMR spectrometer.

To install the probe, the roller carrier with the tension rollers arranged on it, which press on the spring elements, pretensions them by turning them. The support rollers, which are offset upwards, run on the base plate of the shim system, where the entire quick-release unit is attached to it.

By turning back the roller carrier, the spring elements are released and relaxed until the probe is fixed in the final position with its retaining elements. If the roller carrier is turned further as far as it will go, the locking device engages. Cams on the roller carrier, which are in contact with the retaining elements, prevent the probe from rotating back about the z-axis due to the force on it and the retaining elements from sliding out of the forks, which would lead to the probe detaching.

In further preferred embodiments of the invention, the disc-shaped insert part is designed as a quick mounting device, preferably as a bayonet lock, which is rotatable, in particular, about the disc axis parallel to the z-direction. A notable advantage of such an arrangement is that there is a very short actuation path for mounting the probe on the retaining system.

In practice, embodiments of the fastening device according to the invention in which the retaining system is designed as a shim system for field shaping of the homogeneous magnetic field in an NMR spectrometer have also proven themselves.

The scope of the present invention also comprises an NMR measurement arrangement with a fastening device according to the invention of the type described above, which may comprise an NMR magnet system and optionally also a shim system and a cryostat.

Further advantages of the invention will become apparent from the description and the drawings. According to the invention, the above-mentioned features and those described below can each be used in isolation or together in any combination. The embodiments shown and described are not to be interpreted as an exhaustive list but rather have exemplary character for the description of the invention.

BRIEF DESCRIPTION OF THE DRAWINGS

The invention is illustrated in the drawings and will be explained in more detail with reference to embodiments. In the drawings.

DETAILED DESCRIPTION

In general, the invention relates to a modified fastening device for releasably fastening an NMR probe 1 to an NMR magnet 2, the main axis of which runs parallel to a z-direction, with an insert part 3. In order to fasten the NMR probe 1, the insert part 3 is configured to be pushed from below against a retaining system 4 which is arranged on the underside of the NMR magnet 2 and which is rigidly connected to the magnet 2 and is part of the fastening device. A fixed mechanical connection is established between the probe 1 and the insert part 3 on the one hand and between insert part 3 and retaining system 4 on the other hand, once the NMR probe 1 has been pushed against the underside of the insert part 3 that faces away from the retaining system 4 and until the upper end of the probe 1 comes into contact with the upper end of the retaining system 4. The insert part 3 is designed such that, with the aid of at least one spring element 8, in addition to a form fit, a force-variable connection is also established between the probe 1 and the retaining system 4. In particular, the probe 1 fastens to the insert part 3 through a plurality of one-piece rigid retaining elements 6, each of unchangeable fixed length, which are part of the fastening device. In a closed state, there is a connection without mechanical play between the insert part 3 and the retaining elements 6 when the spring element 8 is under mechanical tension.

The present invention is characterized, in particular, in that an annular disc-shaped pretensioning element 9 is arranged between the insert part 3 and the retaining system 4 and is configured so that by rotating the pretensioning element 9 about its disc axis relative to the insert part 3, the pretensioning element 9 presses on and thereby pretensions the spring element 8.

In accordance with the invention, the spring element 8 of the insert part 3 and the retaining elements 6 are configured geometrically such that in an open state, there is a connection with a mechanical play of 0.5 mm to 5 mm between the insert part 3 and the retaining elements 6 when the spring element 8 is pretensioned by the pretensioning element 9.

As a rule, the retaining force will increase continuously when the retaining elements 6 are actuated and will reach its maximum in the final position in the second, closed state.

The disc-shaped insert part 3 is usually configured so that, with the aid of a spring element 8, in addition to a form fit, a variable-force connection is also established between the probe 1 and the retaining system 4, the spring element 8 being configured so that when it is actuated, a spring deflection f≥2 mm is triggered.

FIGS. 1A, 1B, 2A and 2B show preferred embodiments, in which a retaining portion 5 is reversibly mounted on the underside of the retaining system 4 facing away from the magnet and is rigidly fastened to the insert part 3. The retaining portion 5 radially surrounds the insert part 3 when mounted and acts like a protective housing.

The retaining portion 5 may be annular and have on its radially inner side a radially inwardly projecting lug 14 for each spring element 8 of the insert part 3. The fastening device also is held together as a quick-release fastener unit under the pretensioning of the spring elements 8 caused by a rotation of the pretensioning element 9 about its disc axis relative to the insert part 3.

The lugs 14 hold the pretensioning element 9. The necessary number of lugs 14 is therefore independent of the number of spring elements 8.

The spring elements 8 preferably have a fork-shaped receptacle 12 at their respective free end, into which the retaining elements 6 are configured to suspend during mounting by rotating the probe 1 about its axis.

In the embodiments shown, a cam 13 is provided on the pretensioning element 9 to match each fork-shaped receptacle 12 of a spring element 8. The cam 13 rests on the respective retaining element 6 in order to prevent the probe 1 from rotating back about its axis as a result of force being applied, so that the retaining elements 6 can slide out of the fork-shaped receptacles 12, wherein the spring elements 8 are released and relaxed by turning back the pretensioning element until the probe 1 is fixed in the final position with its retaining elements 6.

Furthermore, a locking device 7 is provided here to prevent a retainer from being released unintentionally. In particular, the locking device 7 engages as far as it will go when turning the pretensioning element 9 further, and the cams 13 on pretensioning element 9 which are in contact with the retaining elements 6 prevent the probe 1 from turning back and the retaining elements 6 from sliding out of the fork-shaped receptacles 12.

As can also be seen in FIG. 1A to 2B, the spring link of the disc-shaped insert part 3 is constructed in one piece. Typically, it will be made of non-magnetic material such as spring bronze.

Preferably, a plain bearing—not specifically shown in the drawings—may be provided between the pretensioning element 9 and the retaining system 4 and, alternatively or additionally, between the pretensioning element 9 and the spring elements 8. The materials of the sliding partners in the plain bearing are then selected so as to minimize the operating force and abrasion, with PET-C and spring bronze preferably being used as sliding partners.

Figure 1A:
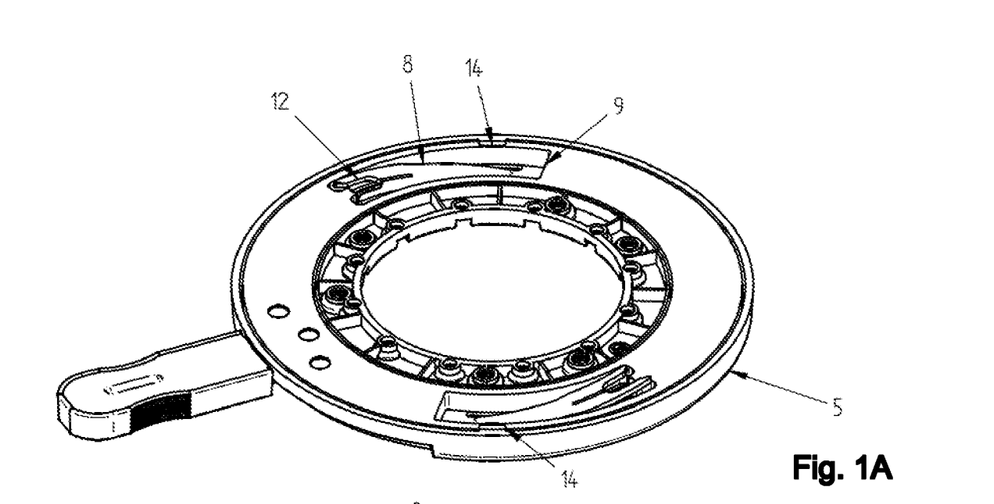
FIG. 1A is a schematic three-dimensional side view at an angle from above of a first embodiment of the fastening device according to the invention with an annular disc-shaped pretensioning element without rollers.
Figure 1B:
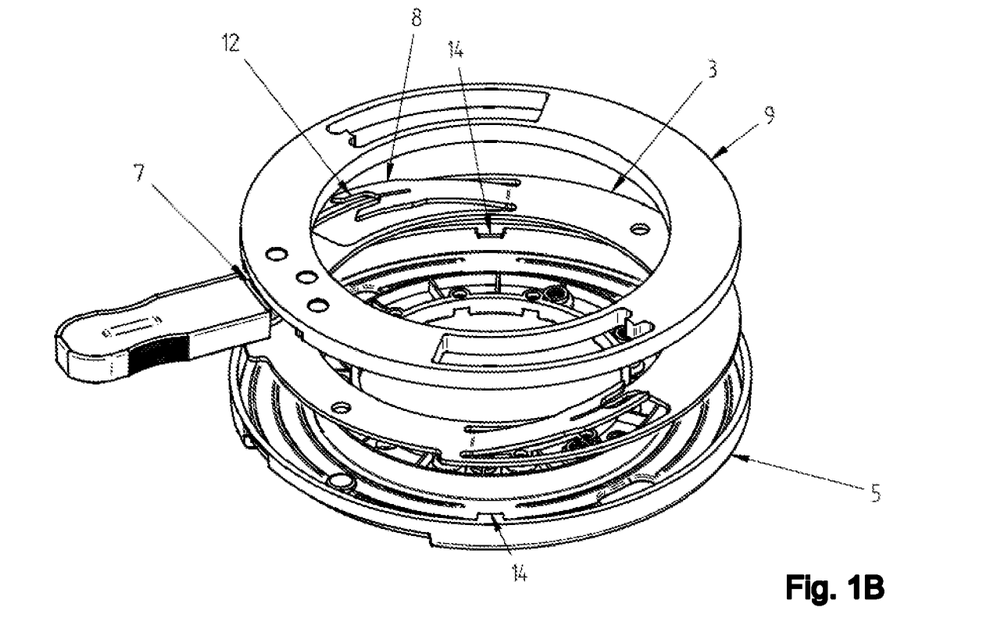
FIG. 1B shows the arrangement of FIG. 1A as an exploded view.

Instead of a continuous annular insert part 3 as in the embodiment of the fastening device according to the invention shown in FIGS. 1A and 1B—in embodiments not specifically shown in the drawings—the insert part is constructed in the form of a disc segment, with each disc segment of this segmented insert part carrying a spring element 8.

Figure 2A:
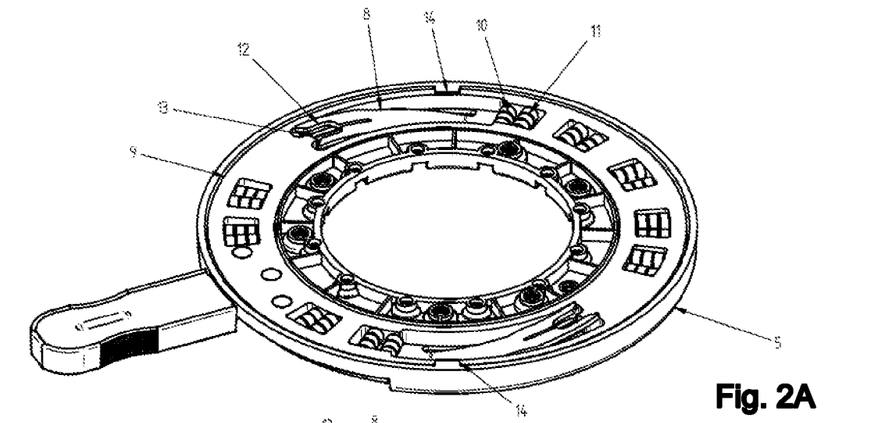
FIG. 2A is a schematic three-dimensional side view at an angle from above of a second embodiment of the fastening device according to the invention with an annular disc-shaped pretensioning element designed as a roller carrier provided with rollers.
Figure 2B:
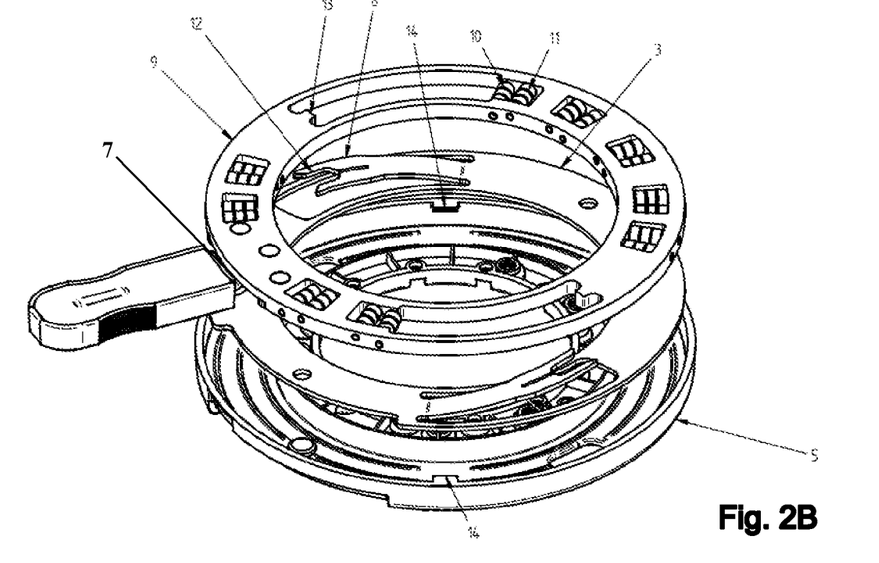
FIG. 2B shows the arrangement of FIG. 2A as an exploded view.

FIGS. 2A and 2B show a preferred embodiment in which the insert part 3 is again constructed in the form of an annular disc and the pretensioning element 9 is designed as a roller carrier supporting a plurality of rollers. In this case, some of the rollers of the pretensioning element 9 are designed as tension rollers 10 which, when the pretensioning element 9 rotates about its disc axis, press on and thereby pretension the spring element 8 relative to the insert part 3.

Some of the rollers are designed as support rollers 11, which press on the retaining system 4 and which roll with little friction when the pretensioning element 9 rotates about its disc axis relative to the insert part 3 on the retaining system 4, in particular on a base plate of a shim system of the NMR magnet 2 for field shaping the homogeneous magnetic field in an NMR spectrometer.

Figure 3:
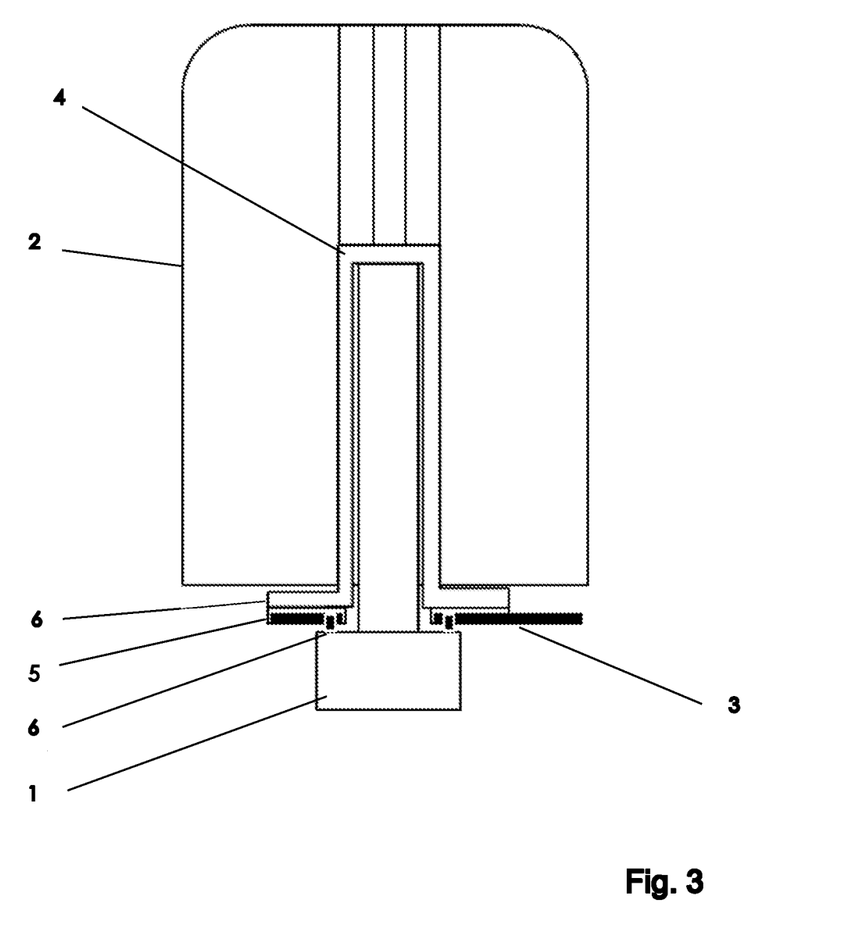
FIG. 3 is a schematic vertical sectional view of an NMR spectrometer with a fastening device according to the invention.

FIG. 3 shows schematically how the fastening system according to the invention makes it possible to quickly mount or dismount an NMR probe 1 on/from an NMR magnet 2. For this purpose, the disc-shaped insert part 3, to which the NMR probe 1 is fastened with the retaining elements 6, is first pushed from below against the underside of a retaining system 4 arranged in the NMR magnet 2 and rigidly connected to the magnet 2. Then, by rotating the insert part 3 about its disc axis, a fixed mechanical connection is established between the probe 1 and the insert part 3 on the one hand and between the insert part 3 and the retaining system 4 on the other.

Incidentally, the retaining system 4 can also be designed as a shim system for field shaping the homogeneous magnetic field in an NMR spectrometer.

Figure 4:
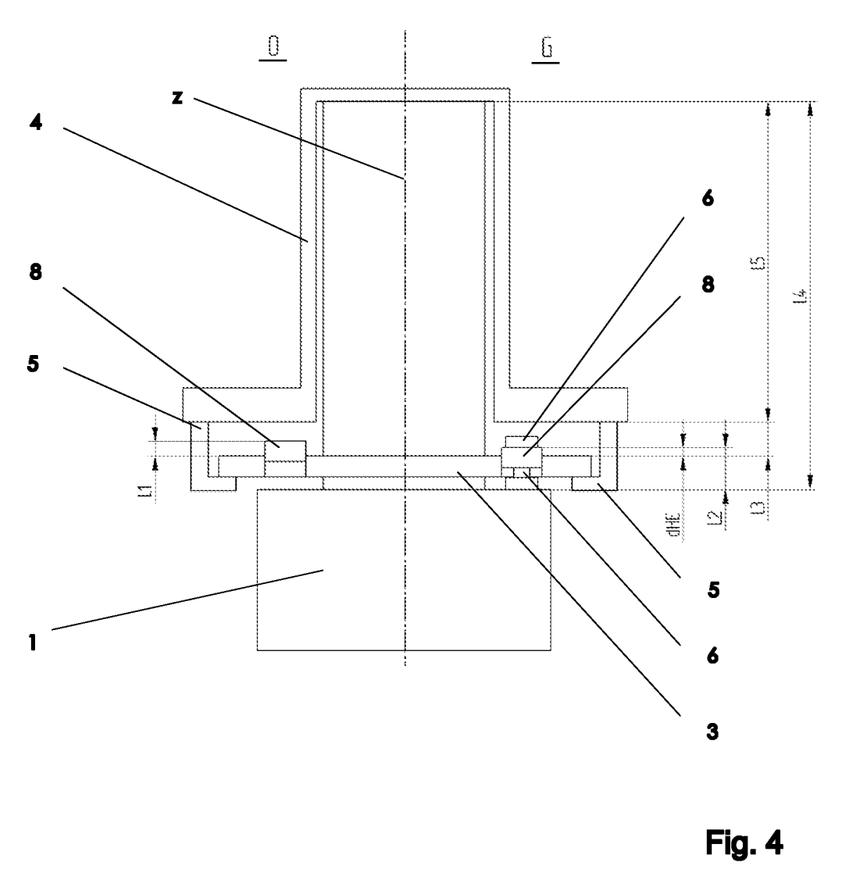
FIG. 4 is a schematic vertical section through a probe mounted on the retaining system with the fastening device according to the invention, namely in the left half of the drawing (O) in the first, open state between the insert part and the retaining elements, and in the right half of the drawing (G) in the second, closed state.

Finally, FIG. 4 illustrates in a schematic vertical section through a probe 1 mounted on the retaining system 4 how the relative distances of the system components involved behave according to the invention in the two highlighted mounting states, namely in the left half of the drawing (marked with "O") in the first, open state between the insert part 3 and the retaining elements 6, and in the right half of the drawing (marked with "G") in the second, closed state:

With the geometric ratios $$(L5\_min+L3\_min)-(L4\_max-L2\_min)=dHE\_min$$

$$(L5\_max+L3\_max)-(L4\_min-L2\_max)=dHE\_max$$

the following geometric conditions must be met:
Geometric condition for freedom from play:

$$L1>dHE\_max$$

Geometric condition for mountability:

$$dHE\_max>0$$

where:
L1=the untensioned height of the spring element 8
L2=the height of the retaining elements 6
L3=the height of the insert part 3
L4=the height of the NMR probe
L5=the height of retaining system 5
dHE=the play between the insert part 3 and the retaining elements 6

LIST OF REFERENCE SIGNS

1 NMR probe
2 NMR magnet
3 Insert part
4 Retaining system
5 Retaining portion
6 Retaining elements
7 Locking device
8 Spring element
9 Annular disc-shaped pretensioning element
10 Tension rollers
11 Support rollers
12 Fork-shaped receptacle
13 Cam
14 Lug

LIST OF REFERENCES

Publications taken into consideration for the assessment of patentability:
[1] DE 10 2017 215 763B3≈EP 3 454 068 B1≈CN 109471052 B≈U.S. Pat. No. 10,379,179 B2
[2] DE 10 2013 204 131 B3
[3] DE 10 2013 212 312 B4
[4] Bruker BioSpin AG company brochure "Manual Probes. User Manual Version 003" from September 2009

What is claimed is:
1. Fastening device for releasably fastening an NMR probe to a Nuclear Magnetic Resonance (NMR) magnet having a main axis that runs parallel to a z-direction, comprising:
  an insert part which, for fastening the NMR probe, is
    configured to press against a retaining system which is arranged on the NMR magnet, is rigidly connected to the magnet and forms part of the fastening device,
    configured to establish a fixed mechanical connection between the probe and the insert part on the one hand and between the insert part and the retaining system on the other hand, once the NMR probe is pressed against a side of the insert part that faces away from the retaining system until the probe comes into contact with the retaining system,
    configured, with at least one spring element, to establish, in addition to a form fit, a force-variable connection between the probe and the retaining system,
  a plurality of one-piece rigid retaining elements, each of fixed length, configured to fasten the probe to the insert part, and in a closed state, to form a connection without mechanical play between the insert part and the retaining elements when the spring element is under mechanical tension, and
  an annular disc-shaped pretensioning element arranged between the insert part and the retaining system, configured such that, by rotating the pretensioning element about its disc axis relative to the insert part, the pretensioning element presses on and thereby pretensions the spring element,
  wherein the spring element of the insert part and the retaining elements are geometrically configured to provide, in an open state, a connection with a mechanical play of 0.5 mm to 5 mm between the insert part and the retaining elements when the spring element is pretensioned by the pretensioning element.

2. Fastening device according to claim 1, wherein the annular disc-shaped pretensioning element is made of non-magnetic material.

3. Fastening device according to claim 2, wherein the annular disc-shaped pretensioning element is made of spring bronze.

4. Fastening device according to claim 1, wherein the at least one spring element comprises a plurality of spring elements distributed uniformly around an axis perpendicular to a plane of the insert part.

5. Fastening device according to claim 1, further comprising a retaining portion reversibly mounted to the retaining system on a side facing away from the magnet and rigidly fastened to the insert part.

6. Fastening device according to claim 5, wherein the retaining portion is annular and has on its radially inner side a radially inwardly projecting lug for each of the spring elements of the insert part, and wherein the fastening device is held together as a quick-release fastener unit under the pretensioning of the spring elements caused by a rotation of the pretensioning element about its disc axis relative to the insert part.

7. Fastening device according to claim 1, wherein each of the spring elements has a fork-shaped receptacle at its respective free end, into which the retaining elements are suspended during mounting by rotating the probe about its axis.

8. Fastening device according to claim 7, further comprising a cam provided on the pretensioning element to match each fork-shaped receptacle of each of the spring elements, which cam rests on the respective retaining element in order to prevent the probe from rotating back about its axis as a result of an applied force, so that the retaining elements slide out of the fork-shaped receptacles, each of the spring elements being released and relaxed by turning back the pretensioning element until the probe is fixed in its final position with its retaining elements.

9. Fastening device according to claim 8, further comprising a locking device for preventing a retainer from being released, the locking device engaging as far as it will go when the pretensioning element is turned further, wherein the cams on the pretensioning element which are in contact with the retaining elements prevent the probe from turning back and the retaining elements from sliding out of the fork-shaped receptacles.

10. Fastening device according to claim 1, wherein the insert part is constructed as disc segments, and wherein each disc segment of the insert part carries one of the spring elements.

11. Fastening device according to claim 10, further comprising a plain bearing between the pretensioning element and the retaining system.

12. Fastening device according to claim 11, wherein materials for sliding partners in each of the plain bearings are selected to minimize operating force and abrasion.

13. Fastening device according to claim 12, wherein the materials for the sliding partners in each of the plain bearings are PET-C and spring bronze.

14. Fastening device according to claim 10, further comprising a plain bearing between the pretensioning element and the spring elements.

15. Fastening device according to claim 14, wherein materials for sliding partners in each of the plain bearings are selected to minimize operating force and abrasion.

16. Fastening device according to claim 15, wherein the materials for the sliding partners in each of the plain bearings are PET-C and spring bronze.

17. Fastening device according to claim 1, wherein the insert part is disc-shaped, and wherein the pretensioning element is a roller carrier carrying rollers.

18. Fastening device according to claim 17, wherein at least some of the rollers of the pretensioning element are tension rollers which, when the pretensioning element rotates about its disc axis relative to the insert part, press on and thereby pretension the spring element.

19. Fastening device according to claim 17, wherein at least some of the rollers of the pretensioning element are support rollers, which press on the retaining system and which roll when the pretensioning element rotates about its disc axis relative to the insert part on the retaining system.

20. Fastening device according to claim 19, wherein at least some of the rollers of the pretensioning element are support rollers, which press on the retaining system and which roll when the pretensioning element rotates about its disc axis relative to the insert part on a base plate of a shim system of the NMR magnet for field shaping the homogeneous magnetic field in an NMR spectrometer.

* * * * *